(12) United States Patent
Morishita

(10) Patent No.: US 11,187,975 B2
(45) Date of Patent: Nov. 30, 2021

(54) CORRECTION PATTERN GENERATION DEVICE, PATTERN DEFECT CORRECTION SYSTEM, CORRECTION PATTERN GENERATION METHOD, AND SEMICONDUCTOR DEVICE MANUFACTURING METHOD

(71) Applicant: Toshiba Memory Corporation, Tokyo (JP)

(72) Inventor: Keiko Morishita, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 238 days.

(21) Appl. No.: 16/287,615

(22) Filed: Feb. 27, 2019

(65) Prior Publication Data
US 2020/0089103 A1 Mar. 19, 2020

(30) Foreign Application Priority Data
Sep. 14, 2018 (JP) .............................. JP2018-173002

(51) Int. Cl.
*G03F 1/72* (2012.01)
*G03F 1/82* (2012.01)
*G03F 7/20* (2006.01)

(52) U.S. Cl.
CPC ................. *G03F 1/72* (2013.01); *G03F 1/82* (2013.01); *G03F 7/705* (2013.01); *G03F 7/7065* (2013.01); *G03F 7/70441* (2013.01); *G03F 7/70508* (2013.01)

(58) Field of Classification Search
CPC .......... G03F 7/72; G03F 1/82; G03F 7/70441; G03F 7/705; G03F 7/70508; G03F 7/70765
USPC ...................................... 355/52, 55
See application file for complete search history.

(56) References Cited

U.S. PATENT DOCUMENTS

| | | | |
|---|---|---|---|
| 7,949,178 B2 * | 5/2011 | Sakai | G06T 7/001 382/144 |
| 8,233,698 B2 * | 7/2012 | Yamashita | G06K 9/32 382/149 |
| 8,719,739 B2 | 5/2014 | Fujimura et al. | |
| 2010/0092876 A1 | 4/2010 | Kanamitsu | |
| 2011/0182496 A1 * | 7/2011 | Sakai | G06T 7/001 382/145 |

(Continued)

FOREIGN PATENT DOCUMENTS

| | | |
|---|---|---|
| JP | 2004037579 A | 2/2004 |
| JP | 2005292342 A | 10/2005 |

(Continued)

*Primary Examiner* — Hung Nguyen
(74) *Attorney, Agent, or Firm* — Kim & Stewart LLP

(57) ABSTRACT

A correction pattern generation device includes a processor configured to receive pattern information for a mask including a defect in a pattern formed on the mask, generate a correction pattern candidate for correcting the defect, calculate a correction difficulty degree for the correction pattern candidate, and select a correction pattern from correction pattern candidates based on the calculated correction difficulty degree for each correction pattern candidate if more than one correction pattern candidate for correcting the defect is generated.

20 Claims, 5 Drawing Sheets

(56) References Cited

U.S. PATENT DOCUMENTS

2012/0198404 A1    8/2012   Hasebe
2020/0159134 A1*   5/2020   Gao .................... G03F 7/70633

FOREIGN PATENT DOCUMENTS

| JP | 2011076146 A | 4/2011 |
|----|--------------|--------|
| JP | 4719262 B2   | 7/2011 |

* cited by examiner (a) (b) (c)

CORRECTION PATTERN GENERATION DEVICE, PATTERN DEFECT CORRECTION SYSTEM, CORRECTION PATTERN GENERATION METHOD, AND SEMICONDUCTOR DEVICE MANUFACTURING METHOD

CROSS-REFERENCE TO RELATED APPLICATION

This application is based upon and claims the benefit of priority from Japanese Patent Application No. 2018-173002, filed Sep. 14, 2018, the entire contents of which are incorporated herein by reference.

FIELD

Embodiments described herein relate generally to a correction pattern generation device, a pattern defect correction system, a correction pattern generation method, and a semiconductor device manufacturing method.

BACKGROUND

In order to form sub-resolution limit features and patterns on a substrate for manufacturing a semiconductor device, a basic pattern on a photomask can further include extremely minute, non-resolved auxiliary patterns, which are sometimes referred to as sub-resolution assist features. However, inclusion of these auxiliary patterns increases the complexity of designing and manufacturing a photomask.

When a defect occurs in formation of such a complicated pattern for a photomask, it takes a long time to correct the defect, and a success rate of the correction may be low in some cases.

DETAILED DESCRIPTION

Figure 1:
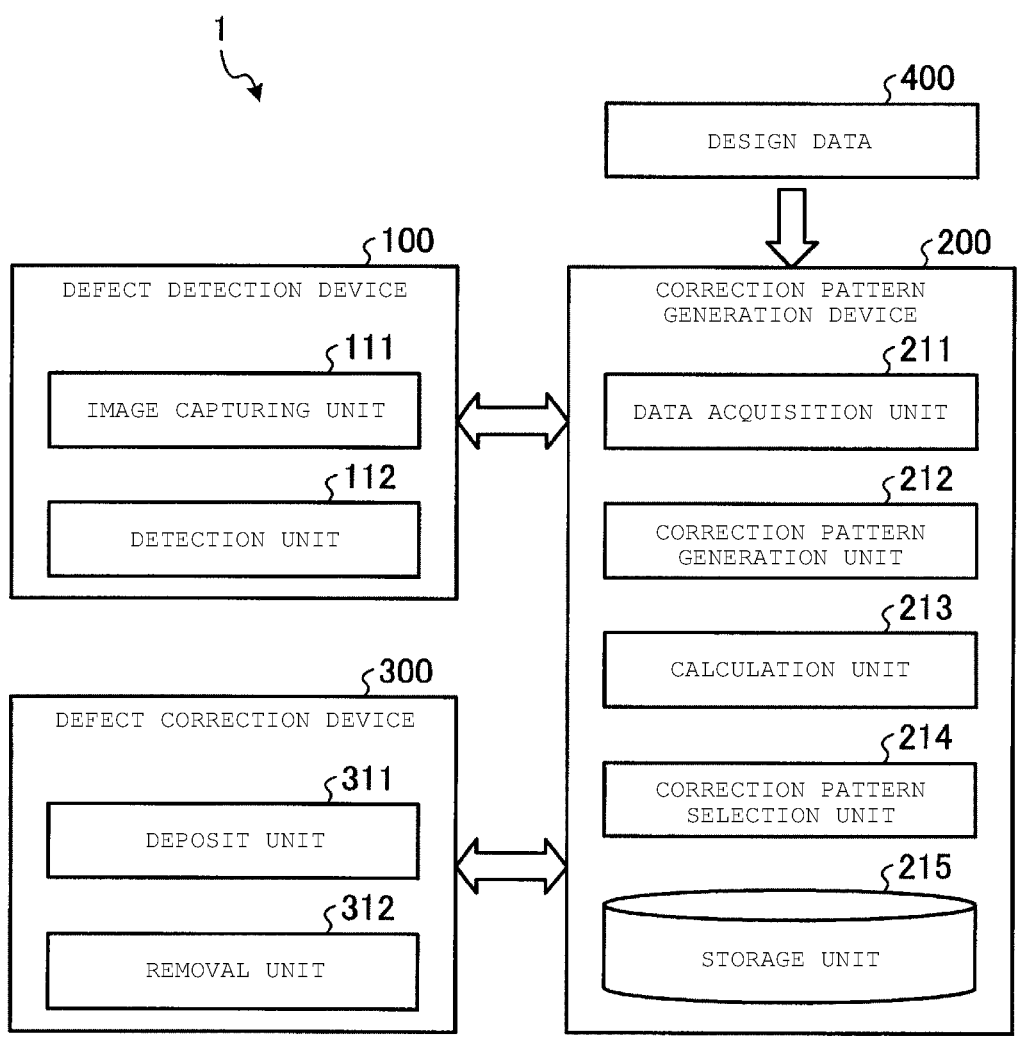
FIG. 1 is a block diagram illustrating a pattern defect correction system according to an embodiment.

Example embodiments provide a correction pattern generation device, a pattern defect correction system, a correction pattern generation method, and a semiconductor device manufacturing method in which pattern defects can be corrected in a short time and with an increased success rate.

In general, according to one embodiment, a correction pattern generation device comprises a processor. The processor is configured to receive pattern information for a mask including a defect in a pattern formed on the mask, generate a correction pattern candidate for correcting the defect, calculate a correction difficulty degree for the correction pattern candidate, and select a correction pattern from correction pattern candidates based on the calculated correction difficulty degree for each correction pattern candidate if more than one correction pattern candidate for correcting the defect is generated.

Hereinafter, the present disclosure will be described in detail with reference to the drawings. The present disclosure is not limited by the particular example embodiments. In addition, various aspects in the following embodiments may be varied according to known variations readily available to those of ordinary skill in the art or substituted with known equivalents.

In a lithography process of a semiconductor device, a fine pattern on a photomask is transferred to a wafer substrate. In general, for semiconductor devices to get smaller, patterns formed on the photomask must also get smaller (finer).

In some instances, to assist formation of a fine pattern on a wafer substrate, the pattern on the photomask may include extremely minute, non-resolved auxiliary patterns. Such non-resolved auxiliary are sometimes referred to as sub-resolution assist features (SRAF). Depending on the mask technology, the auxiliary pattern may be used for an optical proximity correction (OPC) technique, inverse lithography technology (ILT) designs, and the like. In OPC, the basic pattern for the photomask is corrected beforehand such that an intended design pattern and the transferred pattern on the wafer coincide with each other. In ILT, the pattern design for the photomask is performed by a mathematical inverse operation based on the intended designed pattern to be transferred.

In general, for a photomask for either technique, it is necessary to form a photomask pattern substantially free of defects (even those with sizes below the resolving power of the lithography tool on which the photomask will ultimately be used). Accordingly, when a photomask is manufactured, any such pattern defects must be corrected, or the photomask may be unusable.

For example, in a photomask manufacturing process, a desired pattern is drawn on a resist film on a mask substrate, and then the drawn pattern is transferred into a light shielding film formed on the mask substrate by etching using the patterned resist as an etch mask or the like. Thereafter, if a pattern defect is detected by a defect detection device, the detected pattern defect is corrected using a charge particle beam tool.

In the pattern defect correction system according to an embodiment, the pattern defect on the photomask is corrected by changing the pattern defect area to a pattern that is easily corrected.

Configuration Example of Pattern Defect Correction System

FIG. 1 is a block diagram illustrating an example of a configuration of a pattern defect correction system 1 according to an embodiment. As illustrated in FIG. 1, the pattern defect correction system 1 includes a defect detection device 100, a correction pattern generation device 200, and a defect correction device 300. In the pattern defect correction system 1, the defect detection device 100, the correction pattern generation device 200, and the defect correction device 300 are connected so as to communicate with each other.

The defect detection device 100 includes an image capturing unit 111 and a detection unit 112. The image capturing unit 111 images the fine patterns formed on a photomask. The detection unit 112 detects a pattern defect in the photomask's pattern(s) from an image captured by the image capturing unit 111. Detection of the pattern defect may be performed by, for example, comparing a design pattern for a photomask to the captured image or comparing images from adjacent patterns on the photomask, and the like.

The correction pattern generation device 200 includes a data acquisition unit 211, a correction pattern generation unit 212, a calculation unit 213, a correction pattern selection unit 214, and a storage unit 215.

The data acquisition unit 211 acquires an image of the pattern defect on the photomask as captured by the defect detection device 100. In addition, the data acquisition unit 211 acquires a design pattern including information for the intended pattern that is to be transferred onto a wafer from design data 400.

The correction pattern generation unit 212 generates at least one candidate for a correction pattern for correcting a pattern defect from an image of the pattern defect acquired by the data acquisition unit 211 and the design pattern. The correction pattern generation unit 212 generates the correction pattern candidate, based on an optical simulation to which, for example, OPC, ILT, or the like is applied.

The calculation unit 213 calculates a correction difficulty of the correction pattern for the correction pattern candidate generated by the correction pattern generation unit 212. The correction difficulty includes at least one of a defect correction area when the correction pattern is used, time required to correct the defect when the correction pattern is used, a type of the defect determined from an image of the defect, a material of a correction target film relating to the correction of the defect, correction process used for correcting the defect, and a success rate of the correction. The calculation unit 213 may obtain an exposure likelihood for the correction pattern candidate. The exposure likelihood includes a rate at which a intended pattern is obtained on a wafer when the correction pattern is used.

The correction pattern selection unit 214 selects a correction pattern from the correction pattern candidate generated by the correction pattern generation unit 212, based on the correction difficulty calculated by the calculation unit 213. When the calculation unit 213 also calculates the exposure likelihood, the correction pattern may be selected based on the exposure likelihood. For example, the correction pattern selection unit 214 selects a correction pattern from candidates in which the correction difficulty is equal to or less than a predetermined threshold and the exposure likelihood is equal to or greater than the predetermined threshold.

The storage unit 215 stores the various data acquired by the data acquisition unit 211, the correction pattern generated by the correction pattern generation unit 212, a threshold of the correction difficulty, a threshold of the exposure likelihood, and the like.

The defect correction device 300 corrects the pattern defect on the photomask, based on the correction pattern generated and selected by the correction pattern generation device 200. The defect correction device 300 includes a deposit unit 311 and a removal unit 312.

The deposit unit 311 deposits a light shielding film or the like that is damaged due to a pattern defect or the like. For example, the light shielding film or the like may be deposited by baking material gas of the light shielding film to attach onto a photomask by using a charge particle beam.

The removal unit 312 removes the light shielding film or the like in which a film residue is generated due to the pattern defect or the like. The light shielding film and the like may be removed, for example, by sputtering a charge particle beam onto the remaining film portion or by reacting the charge particle beam with an assist gust light shielding film.

Figure 2:
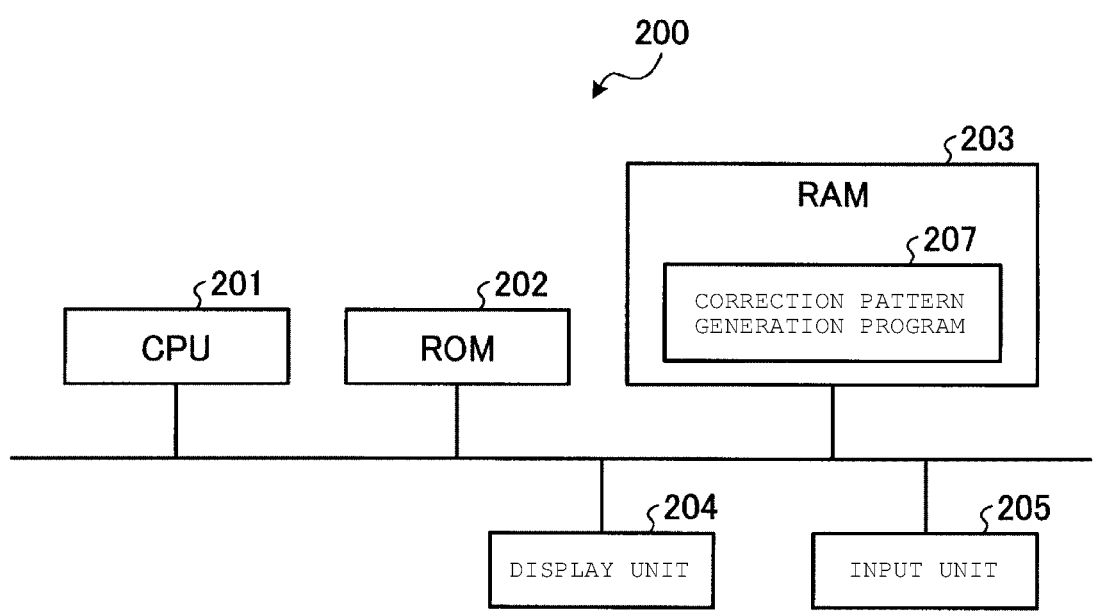
FIG. 2 is a block diagram illustrating aspects of a correction pattern generation device according to an embodiment.

The correction pattern generation device 200 described above has a hardware configuration illustrated in, for example, FIG. 2.

FIG. 2 is a block diagram illustrating an example of the hardware configuration of the correction pattern generation device 200 according to the embodiment. As illustrated in FIG. 2, the correction pattern generation device 200 includes a central processing unit (CPU) 201, a read only memory (ROM) 202, a random access memory (RAM) 203, a display unit 204, and an input unit 205. In the correction pattern generation device 200, the CPU 201, the ROM 202, the RAM 203, the display unit 204, and the input unit 205 are connected to each other via a bus line.

The CPU 201 generates a correction pattern in an area where the pattern defect occurs by using a correction pattern generation program 207, which is a computer program. The correction pattern generation program 207 is a computer program product which can stored in a non-transitory computer readable recording medium to be executed by a computer and includes a plurality of instructions (an algorithm) for generating a correction pattern. In the correction pattern generation program 207, the plurality of instructions configure a computer as specialized machine to perform the processing for generating a correction pattern according to at least the processing described in conjunction with the present disclosure, such as the processing described in conjunction with FIG. 4 and FIG. 5.

The display unit 204 is a display device such as a liquid crystal monitor and displays the generated correction pattern or the like based on an instruction from the CPU 201. The input unit 205 includes a mouse and a keyboard, and receives instruction information (e.g., a parameter or the like necessary for generating the correction pattern according to user preferences) externally input by a user. The instruction information input to the input unit 205 is sent to the CPU 201.

The correction pattern generation program 207 is stored in the ROM 202 and loaded into the RAM 203 via the bus line. FIG. 2 illustrates a state where the correction pattern generation program 207 has been loaded in the RAM 203.

The CPU 201 executes the correction pattern generation program 207 loaded in the RAM 203. Specifically, in the correction pattern generation device 200, the CPU 201 reads the correction pattern generation program 207 from the ROM 202 in accordance with an instruction input from the input unit 205 by a user, loads the correction pattern generation program 207 into a program storage area in the RAM 203, and thereby, various types of processing are performed. The CPU 201 temporarily stores various types of data generated during the various types of processing in a data storage area formed in the RAM 203.

The correction pattern generation program 207 executed by the correction pattern generation device 200 has a module configuration including, for example, the above-described calculation unit and the like, and the program is loaded into the main storage device and is generated on the main storage device.

The respective units such as the data acquisition unit 211, the correction pattern generation unit 212, the calculation unit 213, the correction pattern selection unit 214, and the storage unit 215 of the correction pattern generation device 200 illustrated in FIG. 1 and described above may be implemented by the CPU 201 executing a program, or may be implemented by a dedicated hardware circuit. In addition, the storage unit 215 may be implemented by the ROM 202, the RAM 203, or the like, or may be implemented by an HDD or the like.

Functions of Correction Pattern Generation Device

Figure 3:
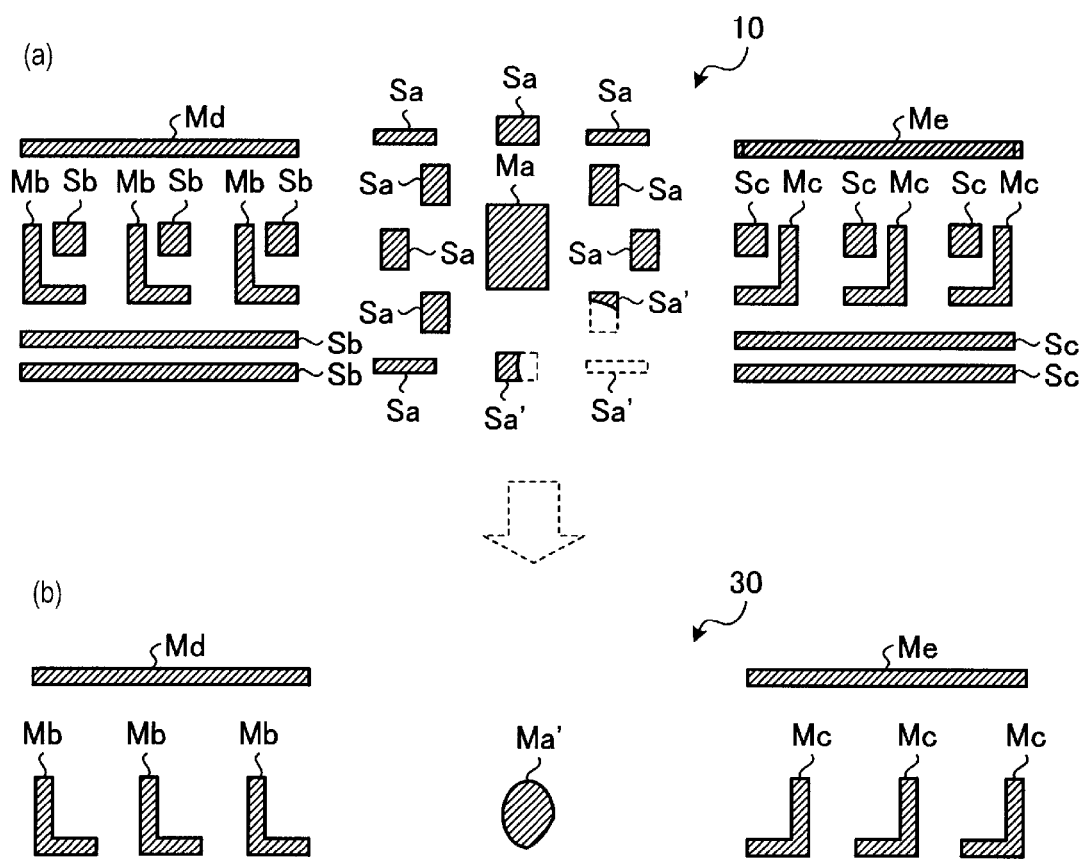
FIG. 3 is a diagram illustrating aspects of a detection of a pattern defect performed by a defect detection device according to an embodiment.

Next, various functions of the correction pattern generation device 200 will be described in detail with reference to FIGS. 3 and 4. FIG. 3 is a diagram illustrating detection of a pattern defect performed by the defect detection device 100.

As illustrated in part (a) of FIG. 3, the defect detection device 100 detects a pattern 10 including a defect on a photomask. In the example of part (a) of FIG. 3, a pattern of the photomask includes main patterns Mb, Mc, Md, and Me. The main patterns Ma to Me are patterns to be transferred onto a wafer. However, the shapes of the main patterns Ma, Mb, Mc, Md, and Me could ultimately be transferred with different shapes from those depicted. A plurality of auxiliary patterns Sa, Sb, and Sc are arranged around the main patterns Ma to Mc, respectively. Main patterns Md and Me do not have auxiliary patterns. In addition, as depicted in FIG. 3, some auxiliary patterns Sa' from among the auxiliary patterns Sa associated with the main pattern Ma are defective (e.g., incompletely formed or missing).

As illustrated in part (b) of FIG. 3, the pattern 10 including the pattern defect on the photomask would be transferred to the wafer as a pattern 30. For example, the main pattern Ma on the photomask is intended provide an elliptical pattern on the wafer to correspond to the shape of the main pattern Ma itself and the auxiliary pattern Sa therearound. However, since some auxiliary patterns Sa (patterns Sa') were damaged/defective, the lower right portion of the intended ellipse pattern resolves as a main pattern Ma', which is damaged, on the wafer. If there were no defect on the photomask, then the intended fully elliptical pattern (Ma) may be obtained on the wafer. For example, an L-shaped main pattern Mb was obtained on the wafer from the (non-defective) main pattern Mb on the photomask in conjunction with the plurality of (non-defective) auxiliary patterns Sb associated therewith. In addition, an inverted L-shaped main pattern Mc is obtained on the wafer from the (non-defective) main pattern Mc on the photomask and the plurality of (non-defective) auxiliary patterns Sc associated thereto. In addition, linear main patterns Md and Me are obtained on the wafer from the (non-defective) main patterns Md and Me on the photomask.

If a pattern defect occurs in the photomask, the correction pattern generation device 200 generates a correction pattern candidate for correcting the pattern defect. This process is illustrated in FIG. 4.

Figure 4:
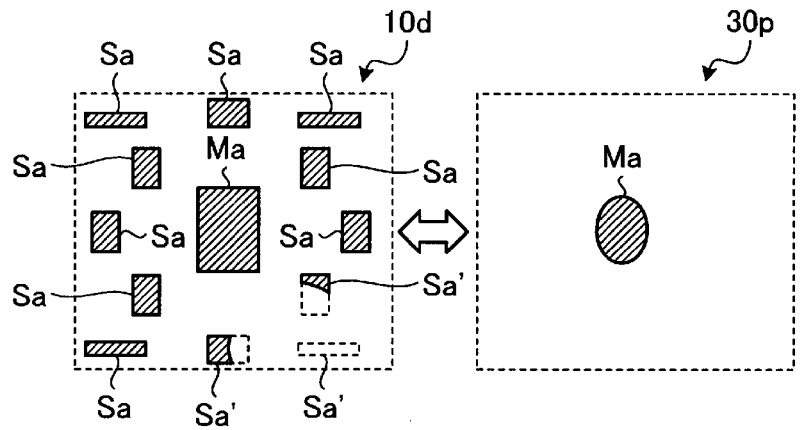
FIG. 4 is a diagram illustrating aspects of a generation of a correction pattern performed by a correction pattern generation device according to an embodiment.
Figure 4:
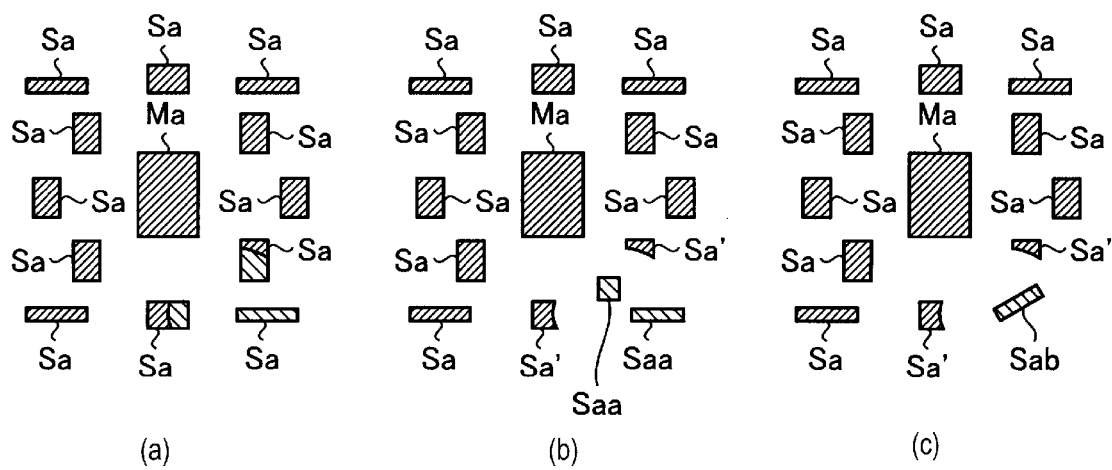
Figure 4:
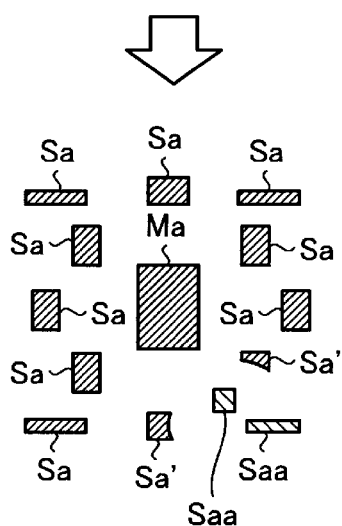

FIG. 4 is a diagram illustrating generation of a correction pattern performed by the correction pattern generation device 200. In the example of FIG. 4, it is assumed that the same defect on the photomask depicted in the example of part (a) of FIG. 3 has occurred.

As illustrated FIG. 4, the correction pattern generation unit 212 extracts a predetermined area 10*d* of the pattern including a defect, based on a captured image including the defect of the photomask. Here, the predetermined area 10*d* includes the main pattern Ma in which there are some auxiliary patterns Sa' that are defective amongst the auxiliary patterns Sa associated with the main pattern Ma. In other words, the predetermined area encompasses a range in which diffracted light from the main pattern Ma the auxiliary pattern Sa' is affected.

Furthermore, the correction pattern generation unit 212 extracts an intended pattern 30*p* (to be formed on a wafer) corresponding to the extracted predetermined area 10*d*, from a design pattern. Here, the intended pattern 30*p* includes the elliptical main pattern Ma. Then, if the correction is performed for the defect in the predetermined area 10*d*, the correction pattern generation unit 212 simulates how to optically obtain a intended pattern 30*p* on the wafer.

As illustrated by possibilities (a), (b), and (c) of FIG. 4, the correction pattern generation unit 212 generates one or more candidates for a corrected pattern, based on the image including the defect in the extracted predetermined area 10*d* and the intended pattern 30*p* to be formed on the wafer. Here, the number of candidates for the correction patterns generated by the correction pattern generation unit 212 is three, but the number of candidates is not necessarily limited to this number and the number can be any number greater than or equal to 1.

The candidate illustrated in part (a) of FIG. 4 is the main pattern Ma and the auxiliary patterns Sa as were intended to be obtained originally on the photomask. That is, according to the candidate illustrated in part (a) of FIG. 4, it is required to correct a deposited film, such as a light shielding film or the like, for defective parts of the auxiliary patterns Sa' in which pattern defects are observed. That is, candidate (a) requires the completion of the originally intended pattern by completion of the missing portions of the auxiliary patterns Sa'.

The candidate illustrated in part (b) of FIG. 4 includes the main pattern Ma and the auxiliary patterns Sa, Sa', and Saa. The auxiliary patterns Saa are newly added, while at least some defective auxiliary patterns Sa' are maintained as incomplete patterns. That is, according to the candidate illustrated in part (b) of FIG. 4, a correction process requires the formation of the newly added auxiliary patterns Saa by adding a deposited film such as a light shielding film at the positions indicated.

The candidate illustrated in part (c) of FIG. 4 includes the main pattern Ma and the auxiliary patterns Sa, Sa', and Sab. The pattern Sab is newly added as oblique auxiliary pattern while some defective auxiliary patterns Sa' are maintained unchanged (incomplete or left missing). That is, according to the candidate illustrated in part (c) of FIG. 4, correction comprises forming the auxiliary pattern Sab by newly adding a deposited film such as a light shielding film.

The calculation unit 213 of the correction pattern generation device 200 calculates a correction difficulty degree for the respective candidates for the correction pattern illustrated in parts (a) to (c) of FIG. 4.

As described above, the correction difficulty degree is defined by obtaining a condition indicating difficulty of correcting a defect correction time or the like. For example, since the candidate illustrated in part (a) of FIG. 4 has many (e.g., at least 3) correction points, it is considered that each defect correction area is relatively narrow, the defect correction time will be long, and a success rate of correction is low. The kind of defect is considered as well and here the defect relates to a pattern damage (missing material), and the material of the correction target film is, for example, Cr or the like which is a material of the light shielding film, and correction processing includes deposit of the light shielding film or the like. The type of correction target film, for example, an additive film process (a film requiring deposit) or a subtractive film process (film requiring removal). In addition to pattern defects, the kinds of the defect include residue of the film being left, collapse of a pattern, a combination of the possible defects, and the like. In addition, correction processing may include removal of portions of the light shielding film in addition to, or instead of, deposition of the light shielding film. Among these various possibilities, it is generally difficult to deposit the light shielding film at pinpoint positions, and thus after such a film is deposited over a range in which deposit is required, removal processing for excess deposited portions outside the particular required position is sometimes required. Furthermore, even when a minute film portion is deposited, there is a risk that the film disappears in cleaning processing. Accordingly, the depositing additional films may be more difficult (higher degree of difficulty) removal of a film for correction processing.

For correction difficulty degrees, part (a) of FIG. 4 is considered higher than the others, and parts (b) and (c) of FIG. 4 are medium difficult. Furthermore, with respect to parts (b) and (c) of FIG. 4, the difficulty degree changes depending on the type of the defect correction device 300 available or to be utilized, such as whether a fine pattern correction is specialized for linear writing (paralleling x-y pattern directions) or an oblique pattern correction is specialized.

In addition, the calculation unit 213 may calculate exposure likelihood for each of the correction pattern candidates illustrated in parts (a) to (c) of FIG. 4.

The exposure likelihood is defined as an acquisition rate of the intended pattern 30$p$ on a wafer when a predetermined candidate is used. That is, the exposure likelihood is a success rate at which the intended pattern 30$p$ is obtained on the wafer. Generally, if the correction difficulty degree is high, the exposure likelihood is also high. For example, as for the candidate illustrated in part (a) of FIG. 4, it is considered that the acquisition rate of the intended pattern 30$p$ also increases as the number of correction points increases.

As illustrated in a lower stage of FIG. 4, the correction pattern selection unit 214 of the correction pattern generation device 200 selects a correction pattern having a moderately low correction difficulty degree, based on the correction difficulty degree described above. In order to select the correction pattern, a correction pattern having the highest correction difficulty degree can be selected from among the correction patterns having a correction difficulty degree less than or equal to a predetermined threshold by setting a threshold value for the correction difficulty degree. Selecting the correction pattern having a moderately low correction difficulty degree decreases the possibility of the correction entirely failing (correction difficulty degree is very high), but if the correction difficulty degree is too low, then typically the intended pattern 30$p$ will be less likely to be obtained on the wafer (acquisition rate is low).

Furthermore, the correction pattern selection unit 214 may use the exposure likelihood obtained by the calculation unit 213 as an index for selecting a correction pattern. That is, in selecting the correction pattern, the correction pattern selection unit 214 can select a correction pattern having a moderately low correction difficulty degree and a moderately high exposure likelihood. As the exposure likelihood increases, the possibility that the intended pattern 30$p$ is obtained will increase, but the correction difficulty degree may also increase. Therefore, a certain threshold may also be defined for the exposure likelihood, and for example, a certain correction pattern may be selected such that the correction difficulty degree is not higher than a certain threshold while the exposure likelihood is not lower than the threshold.

In the example illustrated in the lower stage of FIG. 4, the candidate illustrated in part (b) of FIG. 4 is selected from among the candidates for the correction patterns illustrated in parts (a) to (c) of FIG. 4. However, regardless of the example depicted in FIG. 4, the number of correction patterns need not necessarily be narrowed down to one. That is, a plurality of correction patterns may be selected by the correction pattern selection unit 214.

The defect correction device 300 corrects a pattern defect on the photomask based on the correction pattern generated and selected by the correction pattern generation device 200. Here, since the defect is a type of pattern damage, the correction is made by adding the auxiliary pattern Saa to the photomask.

After the pattern defect on the photomask is successfully corrected, a pattern can be transferred onto a wafer, such as a semiconductor substrate, by using the now corrected photomask.

Example of Manufacturing Processing of Semiconductor Device

Figure 5:
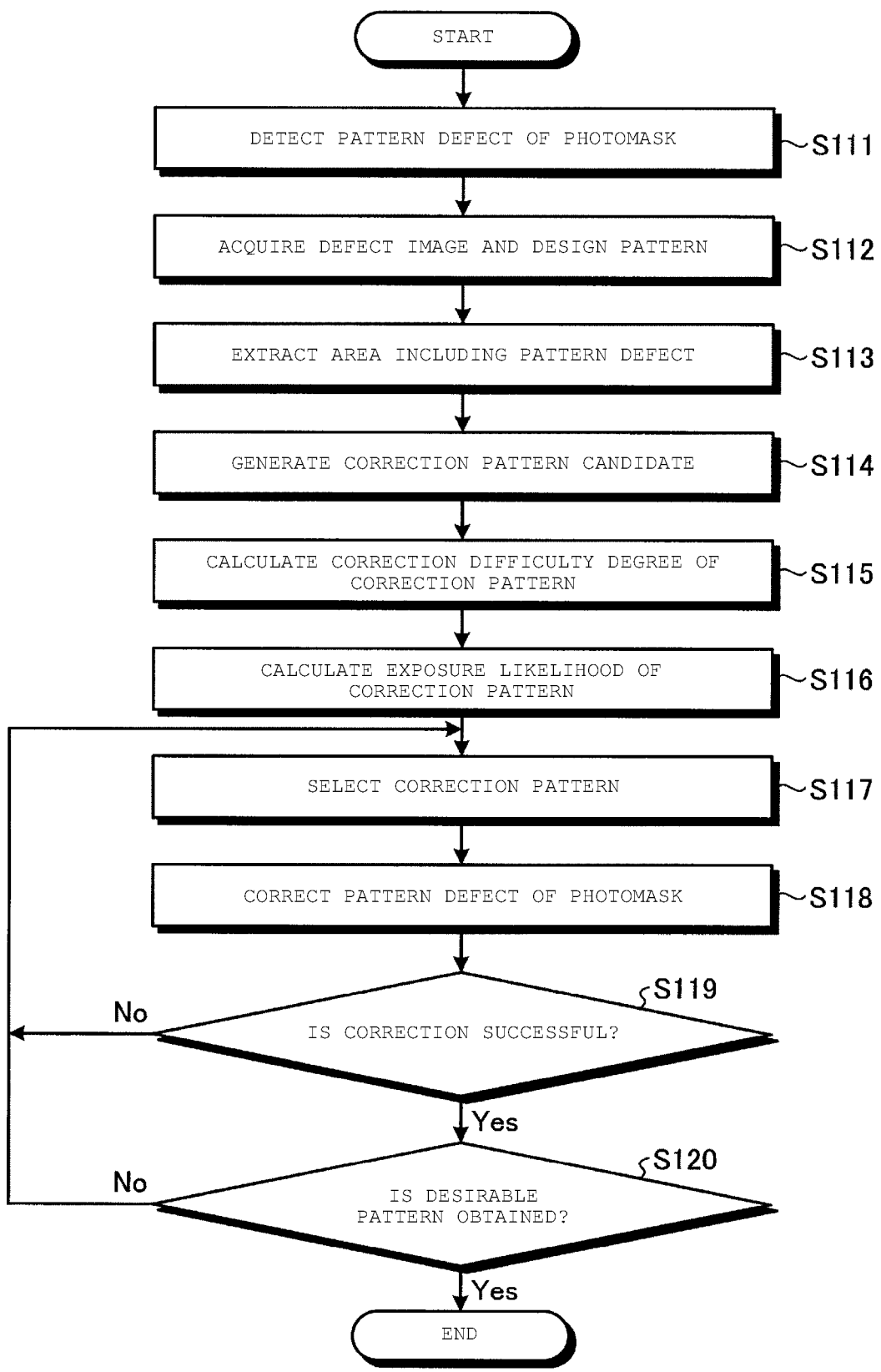
FIG. 5 is a flowchart illustrating aspects of a pattern defect correction processing of a pattern defect correction system according to an embodiment.

Next, pattern defect correction processing as including in the manufacture processing of a semiconductor device will be described with reference to FIG. 5. FIG. 5 is a flowchart illustrating an example of a sequence of pattern defect correction processing of the pattern defect correction system 1.

As illustrated in FIG. 5, the defect detection device 100 detects a pattern defect on a photomask (step S111).

Next, the data acquisition unit 211 acquires an image of the pattern defect on the photomask. In addition, the data acquisition unit 211 acquires a design pattern including intended pattern information for the pattern desired to be transferred onto the wafer (step S112).

Next, the correction pattern generation unit 212 extracts a predetermined area including the pattern defect (step S113). Then, the correction pattern generation unit 212 generates a correction pattern candidate from the image including the photomask defect and the intended pattern on the wafer (step S114).

Next, the calculation unit 213 calculates a correction difficulty degree of each correction pattern candidate (step S115). In addition, the calculation unit 213 calculates exposure likelihood of each candidate (step S116). However, as described above, the calculation unit 213 may instead calculate only the correction difficulty degree without performing step S116 (i.e., without calculating the exposure likelihood for each candidate).

Next, the correction pattern selection unit 214 selects a correction pattern for actual use from the correction pattern candidates (step S117). At this time, the correction pattern selection unit 214 selects a correction pattern, based on the correction difficulty degree of each candidate. When the exposure likelihood is also obtained (in step S116), the correction pattern selection unit 214 may select the correction pattern by using the exposure likelihood of each candidate as an index.

The defect correction device 300 corrects the pattern defect on the photomask based on the correction pattern generated and selected by the correction pattern generation device 200 (step S118).

Next, it is determined whether or not the correction made by the defect correction device 300 was successful (step S119). Such a determination may be made by acquiring data from, for example, the defect correction device 300, the defect detection device 100, or the like, and such a determination may be made by the correction pattern generation device 200 or otherwise.

When the correction fails (step S119: No), the flow after step S117 is repeated. At this time, the correction pattern selection unit 214 may select a correction pattern having a lower correction difficulty degree among the plurality of selected correction patterns. Alternatively, the correction pattern selection unit 214 may reselect the corrected pattern after a threshold of the correction difficulty degree is lowered.

When the correction is successful (step S119: Yes), it is next determined whether or not a intended pattern is obtained on the wafer by using the photomask (step S120). For example, such a determination may be made by the correction pattern generation device 200 by acquiring data from a wafer defect inspection or the like. Alternatively, the pattern which will be transferred onto a wafer after the correction pattern is formed may be predicted and determined by using an image quality evaluation device having the same wavelength and optical system as an exposure device.

When the intended pattern is not obtained (step S120: No), the flow after step S117 is repeated. At this time, the correction pattern selection unit 214 may select a correction pattern with a higher exposure likelihood among the plurality of selected correction patterns. Alternatively, the correction pattern selection unit 214 may reselect the correction pattern after the threshold of the exposure likelihood is increased.

When the intended pattern is obtained (step S120: Yes), the pattern defect correction processing ends.

Thereafter, transfer of the intended pattern onto the wafer and processing of a film to be processed on the wafer are repeated, and thereby, a semiconductor device is manufactured.

Comparative Example

As described above, a pattern of a photomask becomes a complicated pattern including an auxiliary pattern and the like by introducing an OPC, an ILT or the like to provide smaller (finer) features on a wafer substrate. In such a complicated pattern, it is difficult to determine how to correct a defect detected by a defect detection device. In addition to the above-described pattern damage, the type of defect also includes a variety of defects such as a film residue, a pattern collapse, or complex combinations of defects thereof.

Under such circumstances, in a method of correcting a pattern defect in the comparative example, an attempt to correct the pattern defect on the photomask is only made to correct the pattern defect to match the pattern that was originally intended to be obtained in the defect area. However, in such a method, it may take a long time to correct the defect and even if the correction is attempted the success rate for such a correction is often low.

In the pattern defect correction system 1 according to the embodiment, the correction pattern generation device 200 generates possible correction pattern candidates. Then, the correction pattern generation device 200 selects an appropriate correction pattern from the possible candidates based on a correction difficulty degree. Thereby, it is possible to avoid adopting and attempting a correction pattern whose correction difficulty degree is too high, which will shorten the total required correction time and also increase the success rate for correction processing. Thus, it is still possible to obtain an intended pattern on the wafer, but with less time in photomask reworking/correction and/or with less wastage of photomasks.

In the pattern defect correction system 1, the correction pattern generation device 200 selects an appropriate correction pattern from the correction pattern candidates based on exposure likelihood. Thereby, it is possible to increase an acquisition rate of the intended pattern on the wafer while avoiding have to attempt a correction pattern with a very high correction difficulty degree.

In the pattern defect correction system 1 according to the embodiment, the correction pattern generation device 200 generates and selects a correction pattern according to parameters related to correction process difficulty and printed pattern sufficiency (likelihood of a match to intended printed pattern). Thereby, it can be determined how the detected defect is to be corrected more efficiently. In addition, since correction time is shortened and a success rate of correction is increased, turnaround time (TAT) is shortened, and thereby, it is possible to proceed in parallel corrections at several places at once and thereby to shorten the time required for manufacturing each photomask.

The above embodiments show non-limiting examples of some patterns for which OPC or ILT is used. The above embodiments may be applied to any complicated mask patterns including auxiliary patterns or decorations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A correction pattern generation device, comprising:
a processor configured to:
receive pattern information for a mask including a defect in a pattern formed on the mask;
generate correction pattern candidates for correcting the defect;
calculate a correction difficulty degree for each of the correction pattern candidates, the correction difficulty degree being a value corresponding to an expected success rate for correction of the defect by formation of a correction pattern corresponding to the respective correction pattern candidate on the mask; and
select a correction pattern from the correction pattern candidates based on the calculated correction difficulty degree for each correction pattern candidate.

2. The correction pattern generation device according to claim 1, wherein
the processor is further configured to calculate an exposure likelihood for each correction pattern candidate, and
selection of the correction pattern from the correction pattern candidates is further based on the calculated exposure likelihood for each correction pattern candidate.

3. The correction pattern generation device according to claim 1, wherein calculation of the correction difficulty degree includes as an input at least one of the following:
a time required for correcting the defect using the correction pattern candidate,
a defect type of the defect,
a material type of a correction film to be used formation of the correction pattern corresponding to the correction pattern candidate for correcting the defect, and
a correction process required for correcting the defect using the correction pattern candidate.

4. The correction pattern generation device according to claim 1, wherein the correction pattern candidates are generated using an optical simulation.

5. The correction pattern generation device according to claim 4, wherein the processor is further configured to receive original pattern data used for forming the pattern on the mask.

6. The correction pattern generation device according to claim 1, wherein the mask is a photomask and the pattern formed on the mask includes a main pattern transferred to an object and a sub-pattern that is not transferred to the object.

7. A pattern defect correction system, comprising:
a defect detection device configured to detect a defect in a pattern formed on a mask and provide pattern information for the mask including the defect in the pattern;
a correction pattern generation device configured to output a correction pattern for correcting the defect in the pattern; and
a defect correction device configured to correct the defect in the pattern using the correction pattern, wherein
the correction pattern generation device includes a processor configured to:
receive the pattern information from the defect detection device;
generate correction pattern candidates for correcting the defect;
calculate a correction difficulty degree for each of the correction pattern candidates, the correction difficulty degree being a value corresponding to an expected success rate for correction of the defect by formation of a correction pattern corresponding to the respective correction pattern candidate on the mask by use of the defect correction device; and
select a correction pattern for output from the correction pattern candidates based on the calculated correction difficulty degree for each correction pattern candidate.

8. The pattern defect correction system according to claim 7, wherein the defect detection device includes:
an image capturing unit to acquire images of the pattern formed on the mask; and
a detection unit configured detect defects in the pattern formed on the mask by analysis of the images acquired by the image capturing unit.

9. The pattern defect correction system according to claim 8, wherein the defect correction device includes:
a deposit unit to deposit material on the mask; and
a removal unit to remove material on the mask.

10. The pattern defect correction system according to claim 7, wherein the defect correction device includes:
a deposit unit to deposit material on the mask; and
a removal unit to remove material on the mask.

11. The pattern defect correction system according to claim 7, wherein
the processor is further configured to calculate an exposure likelihood for each correction pattern candidate, and
selection of the correction pattern from the correction pattern candidates is further based on the calculated exposure likelihood for each correction pattern candidate.

12. The pattern defect correction system according to claim 7, wherein the processor is further configured to receive original pattern data used for forming the pattern on the mask.

13. The pattern defect correction system according to claim 7, wherein the mask is a photomask and the pattern formed on the mask includes a main pattern transferred to an object and a sub-pattern that is not transferred to the object.

14. The pattern defect correction system according to claim 7, wherein the correction pattern candidates are generated using an optical simulation.

15. A method of correcting a photomask pattern defect, the method comprising:
detecting a defect in a pattern formed on a photomask;
extracting an area of the pattern including the defect;
generating correction pattern candidates for correcting the defect by comparing an intended pattern to be formed with the photomask to a pattern that is expected to be formed using the extracted area of the pattern including the defect;
calculating a correction difficulty degree for correcting the defect using each of the correction pattern candidates, the correction difficulty degree being a value corresponding to an expected success rate for correction of the defect by formation of a correction pattern corresponding to the respective correction pattern candidate on the photomask;
selecting a correction pattern from the correction pattern candidates based on the calculated correction difficulty degree for each correction candidate; and
correcting the defect in the pattern using the selected correction pattern to modify the photomask.

16. The method of correcting a photomask pattern defect according to claim 15, further comprising:
calculating an exposure likelihood for each correction pattern candidate, wherein
selection of the correction pattern from the correction pattern candidates is further based on the calculated exposure likelihood for each correction pattern candidate.

17. The method of correcting a photomask pattern defect according to claim 15, wherein the pattern formed on the mask includes sub-resolution assist features.

18. The correction pattern generation device according to claim 6, wherein the defect is in the sub-pattern.

19. The correction pattern generation device according to claim 1, wherein the pattern information for the mask is acquired from an image of the pattern formed on the mask.

20. The correction pattern generation device according to claim 1, wherein generation of correction pattern candidates is based on an intended pattern to be transferred to an object using the mask.

* * * * *

UNITED STATES PATENT AND TRADEMARK OFFICE
CERTIFICATE OF CORRECTION

PATENT NO. : 11,187,975 B2
APPLICATION NO. : 16/287615
DATED : November 30, 2021
INVENTOR(S) : Keiko Morishita Page 1 of 1

It is certified that error appears in the above-identified patent and that said Letters Patent is hereby corrected as shown below:

In the Claims

In Column 11, Claim 8, Line 42, please insert --to-- before "detect".

Signed and Sealed this
Sixth Day of December, 2022

Katherine Kelly Vidal
*Director of the United States Patent and Trademark Office*